United States Patent [19]

Bingham

[11] Patent Number: 4,529,948
[45] Date of Patent: Jul. 16, 1985

[54] CLASS AB AMPLIFIER

[75] Inventor: David Bingham, San Jose, Calif.

[73] Assignee: Intersil, Inc., Cupertino, Calif.

[21] Appl. No.: 669,060

[22] Filed: Nov. 7, 1984

Related U.S. Application Data

[63] Continuation of Ser. No. 468,070, Feb. 22, 1983, abandoned.

[51] Int. Cl.³ .............................................. H03F 3/26
[52] U.S. Cl. .................................. 330/264; 330/267; 330/151
[58] Field of Search .............. 330/263, 264, 267, 269, 330/277, 149

[56] References Cited

U.S. PATENT DOCUMENTS 4,333,057 6/1982 Hoover .............................. 330/264

Primary Examiner—James B. Mullins
Assistant Examiner—G. Wan
Attorney, Agent, or Firm—Spensley Horn Jubas & Lubitz

[57] ABSTRACT

A class AB CMOS amplifier having a particular circuit configuration and useful in a variety of products such as operational amplifiers, chopper stabilized amplifiers, commutating autozero amplifiers and the like.

36 Claims, 2 Drawing Figures

CLASS AB AMPLIFIER

CROSS REFERENCE TO RELATED APPLICATION

This application is a continuation of patent application Ser. No. 468,070, filed 02/22/83, which has been abandoned.

BACKGROUND OF THE INVENTION

1. Field of the Invention

The present invention relates to a class AB amplifier and, more particularly, to a CMOS amplifier useful in a variety of products such as operational amplifiers, chopper stabilized amplifiers, commutating autozero, amplifiers and the like.

2. Description of the Prior Art

FIG. 1 shows an amplifier circuit that is widely used in a variety of products. The amplifier is most conveniently implemented using complementary MOS technology and has been incorporated in operational amplifiers, chopper stabilized amplifiers, commutating autozero amplifiers and the like.

Such prior art amplifier circuit, generally designated 10, has an input terminal 11, an output terminal 12, a first voltage supply V+, a second voltage supply V−, four matched transistors having a given polarity, designated $P_1$, $P_2$, $P_3$ and $P_4$, two matched transistors having an opposite polarity, designated $N_1$ and $N_2$, a current source 13, a resistor R and a capacitor $C_1$, all interconnected as shown. While amplifier 10 could be implemented with bipolar transistors, the preferred implementation utilizes CMOS technology so that transistors $P_1$–$P_4$ are P-type transistors and transistors $N_1$ and $N_2$ are N-type transistors, although the types could be reversed. Each transistor has a pair of output terminals (source and drain), a control terminal (gate) and a substrate, the sources of all transistors being connected to the substrates, as shown. During the description of amplifier 10, reference will be made to the voltage at a node A, which is the common connection point of the drains of transistors $P_1$ and $P_2$ and the gates of transistors $P_2$ and $P_3$, and the voltage at a node B at the junction between the drains of transistors $P_3$ and $N_1$.

When implemented using CMOS technology, each transistor has a size which is defined as the ratio of the channel width W to the channel length L (W/L). In a typical implementation of amplifier 10, the sizes of the various transistors are adjusted relative to each other in accordance with the following relationships:

$$P_1/P_2 = 3, \tag{1}$$

$$P_4/(P_1+P_2) = N_2/N_1 = 25, \text{ and} \tag{2}$$

$$(P_1+P_2)/P_3 = 1. \tag{3}$$

While these values can be different, the above represents a preferred implementation of amplifier 10.

In discussing the operation of amplifier 10, certain assumptions will be made. That is, transistors $P_1$–$P_4$ are matched in that they are all made from the same process steps and the threshold voltages of all are virtually identical. The same is the case with transistors $N_1$ and $N_2$. The quiescent operating point of amplifier 10 is defined when the voltage at node A equals the input voltage at terminal 11, $V_{IN}$. The ratios of the transistor sizes are precisely as discussed above; the output impedances of all transistors are extremely high; and current source 13 is an ideal current source. The above assumptions are reasonable in that practical errors, such as transistor finite output resistances and mismatch of transistor sizes, will cause only minor errors, such as a slight difference in the voltage at node A as compared to the voltage at input terminal 11 for the setting up of the quiescent biasing conditions.

It should be noted that resistor R and capacitor $C_1$ are usually required to provide the dominant pole and a zero when amplifier 10 is used in conjunction with a first stage (operational amplifier usage) to provide AC stablility. Under some circumstances, such as for low frequency operation or with loads that are not highly capacitive, R may be omitted. However, omitting R will degrade high frequency stability and performance.

An analysis of amplifier 10 will show that the value of the current $I_2$ will equal the value of the current $I_1$ and since transistor $N_2$ will multiply the current $I_2$ by the ratio of its size compared to $N_1$, $I_3$ will equal $25I_1$. The value of the current sourced by transistor $P_4$ is identical to that sunk by transistor $N_2$. The transconductance of amplifier 10 under quiescent conditions is four times the transconductance of transistor $P_4$. Hence, in order to obtain a reasonably high ratio of maximum output sink current to quiescent current (here four), amplifier 10 has nonsymmetrical gain through its two signal paths to output terminal 12; one path going through transistors $P_1$, $P_2$, $P_3$, $N_1$ and $N_2$ (hereinafter "the first signal path") and the other going through transistor $P_4$ (hereinafter "the second signal path").

As the input voltage $V_{IN}$ is increased in a negative sense, the gain of the first signal path increases as the output sinking current through transistors $N_2$ decreases. At the same time, the impedances at nodes A and B increase. The two poles associated with these two nodes decrease in frequency accordingly. These poles, together with the poles associated with the input and output nodes, can produce sufficient phase shift around the loop (from input node 11 to node A, to node B, to output node 12 back through R and $C_1$ to input node 11) to cause instability at high frequencies. If the transconductance of transistor $P_4$ could be increased, the overall loop gain could be increased. However, due to biasing considerations, $P_4$ cannot be changed.

The conclusion is, therefore, that amplifier 10 has stability limitations which limit the gain through the first signal path so that the ratio $P_1$ to $P_3$ cannot be increased to a value greater than about three without limiting severely the capacitive loading on output node 12. On the other hand, it is desirable to be able to increase the ratio of $P_1$ to $P_2$ as high as possible to increase the ratio of peak sinking current in transistor $N_2$ to the quiescent output current. A manner of doing this has been unknown heretofore.

SUMMARY OF THE INVENTION

According to the present invention, there is provided an improved class AB amplifier which solves the problems discussed above. The present amplifier is suitable for use as an output stage for operational amplifiers and instrumentation amplifiers and can be operated over a wide temperature range and a wide supply voltage range. The present amplifier has an output voltage swing that can approach in value the supply voltages. The present amplifier has a high voltage gain and an easy means to set up a quiescent operating current. The present amplifier also has a high ratio of peak sourcing and sinking output currents to quiescent current and may be reproduced for low cost manufacture. The present amplifier has good inherent stability (from potential oscillation) under reasonable output conditions of sourcing or sinking current while driving various output loads (which may consist of various combinations of resistive, capacitve and inductive elements).

Briefly, the present invention improves the basic circuit shown in FIG. 1 by modifying the first signal path at high frequencies and by reducing the maximum value of transconductance through such path as the current through transistor $P_3$ is reduced to a small percentage of its quiescent value. This is achieved by providing a feedforward signal from input terminal 11 to node B through a small capacitor together with a fixed value current into node B from an additional P-type transistor to modify the impedance at node b as an input signal causes transistor $P_3$ to approach cutoff.

Injecting a fixed current into node B will prevent transistor $N_2$ from turning off completely and reduces the loop transconductance through transistors $P_1$, $P_2$, $P_3$, $N_1$ and $N_2$ significantly as transistor $P_3$ turns off. Secondly, the fixed current into node B prevents the pole at this point from moving down in frequency below a defined frequency. The feedforward of the input signal into node B can also be made to dominate the signal from transistor $P_3$ above a frequency at which the excess phase shift of the signal from transistor $P_3$ approaches an undesired phase margin value (usually less than 60°).

OBJECTS, FEATURES AND ADVANTAGES

It is therefore the object of the present invention to solve the problems encountered heretofore with an amplifier as shown in FIG. 1. It is a feature of the present invention to solve these problems by the provision of a modified amplifier circuit. An advantage to be derived is an amplifier suitable for use as an output stage for operational amplifiers, instrumentation amplifiers and the like. A further advantage is an amplifier suitable for operation over a wide temperature range. A further advantage is an amplifier suitable for operation over a wide supply voltage range. Another advantage is an amplifier having an output voltage swing that can approach in value the supply voltage(s). Still another object of the present invention is an amplifier having a high voltage gain. An additional advantage is an amplifier having an easy means to establish a quiescent operating current. Another advantage is an amplifier having a high ratio of peak sourcing and sinking output currents to quiescent current. Another advantage is an amplifier having good inherent stability. Another advantage is an amplifier which is reproducible for low-cost manufacture.

Still other objects, features, and attendant advantages of the present invention will become apparent to those skilled in the art from a reading of the following detailed description of the preferred embodiment constructed in accordance therewith, taken in conjunction with the accompanying drawings wherein like numerals designate like parts in the several figures and wherein:

DESCRIPTION OF THE PREFERRED EMBODIMENTS

Figure 1:
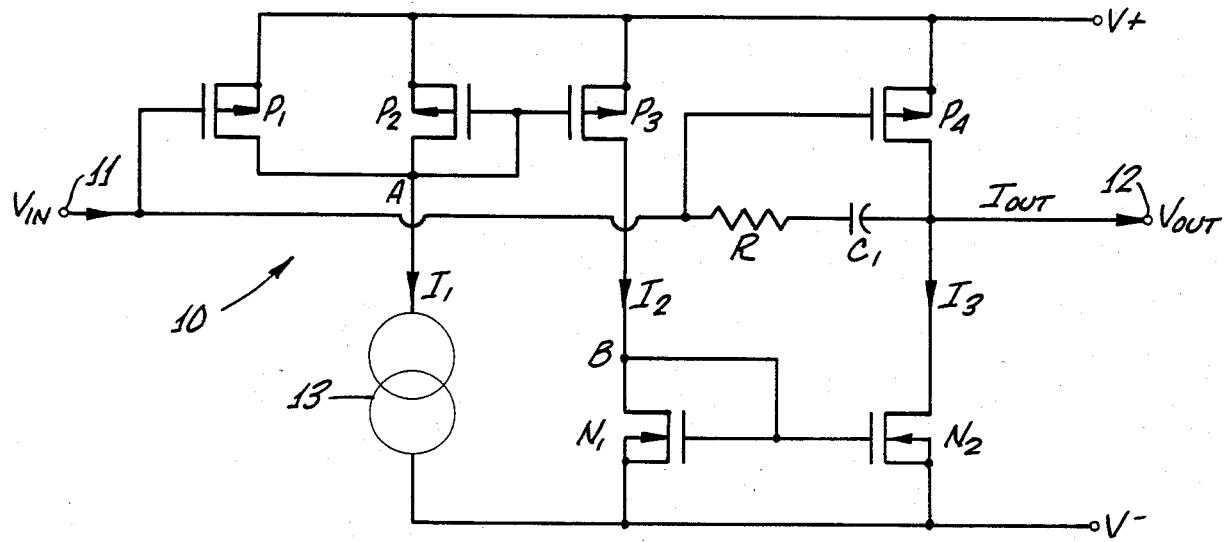
FIG. 1 is a circuit diagram of a prior art amplifier.
Figure 2:
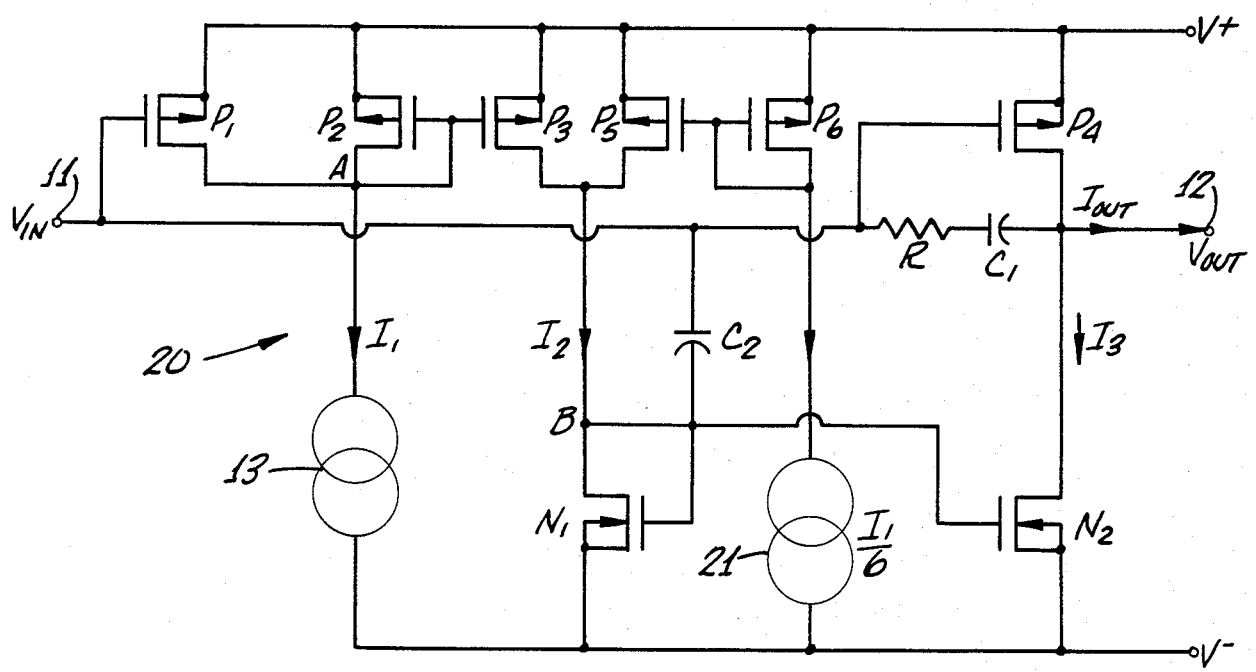
FIG. 2 is a circuit diagram of an amplifier constructed in accordance with the teachings of the present invention.

Referring now to the drawings and, more particularly, to FIG. 2 thereof, there is shown an amplifier, generally designated 20, constructed in accordance wiith the teachings of the present invention. Since amplifier 20 is an improvement to amplifier 10, the corresponding components have been given the same reference numerals. Furthermore, the same assumptions which were made with regard to amplifier 10 will be made with regard to amplifier 20 in the following description.

Amplifier 20 improves amplifier 10 by modifying the signal path at high frequencies through transistors $P_1$, $P_2$, $P_3$, $N_1$ and $N_2$ (the first signal path) and by reducing the maximum value of transconductance through the first signal path as the current through transistor $P_3$ is reduced to a small percentage of its quiescent value. More specifically, in order to improve the phase margin and gain of the first signal path, a feedforward signal from input terminal 11 to node B is provided through a small capacitor $C_2$ (approximately 5 pf) together with a fixed value current into node B to modify the impedance thereat as an input signal causes transistor $P_3$ to approach cutoff. This latter effect is achieved by adding two additional transistors $P_5$ and $P_6$ which are matched to transistors $P_1$, $P_2$, $P_3$ and $P_4$ and a second current source 21. The sources of transistors $P_5$ and $P_6$ are connected to V+, the drain of transistor $P_5$ is connected to the drain of transistor $P_3$ and current source 21 is connected between voltage supply V− and the drain of transistor $P_6$ and the gates of transistors $P_5$ and $P_6$.

In amplifier 20, injecting a fixed current into node B via transistors $P_5$ and $P_6$ and current source 21 will prevent transistor $N_2$ from turning off completely and will reduce the transconductance of the first signal path significantly as transistor $P_3$ turns off. Secondly, this fixed current into node B prevents the pole thereat from moving down in frequency below an ascertainable frequency which is a function of the transconductance of transistor $N_1$ and the total effective capacitance at node B. The feedforward of the input signal, via capacitor $C_2$, into the same node B also can be made to dominate the signal from transistor $P_3$ above a frequency at which the excess phase shift of the signal from transistor $P_3$ approaches an undesired phase margin value (usually less than 60°).

The frequency, gain and phase margin characteristics of the first signal path vary greatly, depending on the value of the drain-to-source currents of transistors $P_1$, $P_2$, $P_3$, $N_1$ and $N_2$ and the exact nodal capacitances of nodes A and B, together with whether these capacitances are gate-to-source, parasitic, or drain-to-gate (Miller). An exact expression to define this relationship is extremely difficult to derive and not necessary for an understanding of the present invention. Suffice it to say that computer simulations permit satisfactory iterations of the variables to be tried in a manner analogous to breadboarding. Based on these types of computer simulations, as well as a practical verification, amplifier 20 evidences significant performance improvements over amplifier 10.

That is, output capacitive loads (which reduce the frequency of the output pole) can be typically increased by a factor of ten (50 pf to 500 pf) prior to the onset of instability. The high frequency phase characteristics slowly shift due to the now-dominant output pole similar to that of a conventional CMOS inverter. Amplifier 20 is thus suitable for use as an output stage for operational amplifiers, instrumentation amplifiers and the like, having a wide temperature range and a wide supply voltage range. The output voltage swing can approach in value the supply voltages and the circuit has high transconductance. The circuit is easily reproducible using CMOS technology, it is easy to set up a quiescent operating current, and the circuit has a high ratio of peak sourcing and sinking output currents to quiescent current.

While a configuration utilizing CMOS technology has been shown with P-channel transistors in the upper half of the circuit and N-channel transistors in the lower half of the circuit, amplifier 20 may be constructed replacing all N-channel transistors with P-channel transistors and P-channel transistors with N-channel transistors, in which case the supply voltage polarities would be reversed, and can be constructed using bipolar transistors. Furthermore, while various ratios of transistors have been given, these can be modified as required for different operating conditions.

While the invention has been described with respect to the preferred physical embodiment constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

I claim:

1. An amplifier having an input and an output and first and second voltage supplies of opposite polarity comprising:
   first through sixth matched transistors having a given polarity, each having a pair of output terminals and a control terminal, one of the output terminals of all of said transistors being connected to said first voltage supply, the control terminals of said first and fourth transistors being connected to said amplifier input, the other of the output terminals of said fourth transistor being connected to said amplifier output;
   first and second current sources, one side of each of said sources being connected to said second voltage supply;
   first and second capacitors, said first capacitor being connected between said amplifier input and output; and
   seventh and eighth matched transistors having a polarity opposite to that of said first through sixth transistors, each having a pair of output terminals and a control terminal, one of the output terminals of said seventh and eighth transistors being connected to said second voltage supply, the other of the output terminals of said first and second transistors and the control terminals of said second and third transistors being connected to the other side of said first current source, the control terminals of said fifth and sixth transistors and the other of the output terminals of said sixth transistor being connected to the other side of said second current source, the other of the output terminals of said third and fifth transistors being connected to the other of the output terminals of said seventh transistor and to the control terminals of said seventh and eighth transistors, said second capacitor being connected between said amplifier input and the control terminals of said seventh and eighth transistors, the other of the output terminals of said eighth transistor being connected to said amplifier output.

2. An amplifier according to claim 1, further comprising:
   a resistor connected in series with said first capacitor, between said amplifier input and output.

3. An amplifier according to claim 1, wherein all of said transistors are manufactured utilizing complementary MOS technology on a single substrate.

4. An amplifier according to claim 3, wherein said first through sixth transistors are P-channel transistors, said seventh and eighth transistors are N-channel transistors, and said first voltage supply is a positive voltage compared to said second voltage supply.

5. An amplifier according to claim 3, wherein said first through sixth transistors are N-channel transistors, said seventh and eighth transistors are P-channel transistors, and said first voltage supply is negative compared to said second voltage supply.

6. An amplifier according to claim 3, wherein each of said transistors has a size defined by the ratio of its channel width to its channel length and wherein the ratio of the size of said first transistor to the size of said second transistor is three, the ratio of the size of said fourth transistor to the sum of the sizes of said first and second transistors is equal to the ratio of the size of said seventh transistor to the size of said eighth transistor, the ratio of the sum of the sizes of said first and second transistors to the size of said third transistor is one, and the ratio of the size of said fifth transistor to the size of said sixth transistor is one.

7. An amplifier according to claim 6, wherein the ratio of the size of said seventh transistor to the size of said eighth transistor is 25.

8. An amplifier according to claim 7, wherein the current output of said second current source is one-sixth the current output of said first current source.

9. An amplifier having an input and an output and first and second voltage supplies, said first voltage supply being positive with respect to said second voltage supply, comprising:
   first through sixth matched P-channel transistors, each having a source, a drain, a gate and a substrate, the source of all of said transistors being connected to said substrate and to said first voltage supply, the gates of said first and fourth transistors being connected to said amplifier input, the drain of said fourth transistor being connected to said amplifier output;
   first and second current sources, one side of each of said sources being connected to said second voltage supply;
   first and second capacitors, said first capacitor being connected between said amplifier input and output; and
   seventh and eighth matched N-channel transistors, each having a source, a drain, a gate and a substrate, said sources of said seventh and eighth transistors being connected to said substrate thereof and to said second voltage supply, the drains of said first and second transistors and the gates of said second and third transistors being connected to the other side of said first current source, the gates of said fifth and sixth transistors and the drain of said sixth transistor being connected to the other side of said second current source, the drains of said third and fifth transistors being connected to the drain of said seventh transistor and to the gates of said seventh and eighth transistors, said second capacitor being connected between said amplifier input and said gates of said seventh and eighth transistors, the drain of said eighth transistor being connected to said amplifier output.

10. An amplifier according to claim 9, further comprising:
a resistor connected in series with said first capacitor, between said amplifier input and output.

11. An amplifier according to claim 9, wherein each of said transistors has a size defined by the ratio of its channel width to its channel length and wherein the ratio of the size of said first transistor to the size of said second transistor is three, the ratio of the size of said fourth transistor to the sum of the sizes of said first and second transistors is equal to the ratio of the size of said seventh transistor to the size of said eighth transistor, the ratio of the sum of the sizes of said first and second transistors to the size of said third transistor is one, and the ratio of the size of said fifth transistor to the size of said sixth transistor is one.

12. An amplifier according to claim 11, wherein the ratio of the size of said seventh transistor to the size of said eighth transistor is 25.

13. An amplifier according to claim 12, wherein the current output of said second current source is one-sixth the current output of said first current source.

14. An amplifier having an input and an output and first and second voltage supplies, said first voltage supply being negative with respect to said second voltage supply, comprising:
first through sixth matched N-channel transistors, each having a source, a drain, a gate and a substrate, the sources of all of said transistors being connected to said substrate and to said first voltage supply, the gates of said first and fourth transistors being connected to said amplifier input, the drain of said fourth transistor being connected to said amplifier output;
first and second current sources, one side of each of said sources being connected to said second voltage supply;
first and second capacitors, said first capacitor being connected between said amplifier input and output; and
seventh and eighth matched P-channel transistors, each having a source, a drain, a gate and a substrate, said sources of said seventh and eighth transistors being connected to said substrate thereof and to said second voltage supply, the drains of said first and second transistors and the gates of said second and third transistors being connected to the other side of said first current source, the gates of said fifth and sixth transistors and the drain of said sixth transistor being connected to the other side of said second current source, the drains of said third and fifth transistors being connected to the drain of said seventh transistor and to the gates of said seventh and eighth transistors, said second capacitor being connected between said amplifier input and said gates of said seventh and eighth transistors, the drain of said eighth transistor being connected to said amplifier output.

15. An amplifier according to claim 14, further comprising:
a resistor connected in series with said first capacitor, between said amplifier input and output.

16. An amplifier according to claim 14, wherein each of said transistors has a size defined by the ratio of its channel width to its channel length and wherein the ratio of the size of said first transistor to the size of said second transistor is three, the ratio of the size of said fourth transistor to the sum of the sizes of said first and second transistors is equal to the ratio of the size of said seventh transistor to the size of said eighth transistor, the ratio of the sum of the sizes of said first and second transistors to the size of said third transistor is one, and the ratio of the size of said fifth transistor to the size of said sixth transistor is one.

17. An amplifier according to claim 16, wherein the ratio of the size of said seventh transistor to the size of said eighth transistor is 25.

18. An amplifier according to claim 17, wherein the current output of said second current source is one-sixth the current output of said first current source.

19. In an amplifier of the type having an input and an output; first and second voltage supplies of opposite polarities; first through fourth transistors, each having a pair of output terminals and a control terminal, one of the output terminals of all of said transistors being connected to said first voltage supply, the control terminals of said first and fourth transistors being connected to said amplifier input, the other of the output terminals of said fourth transistor being connected to said amplifier output; a current source, one side of said source being connected to said second voltage supply; a capacitor connected between said amplifier input and output; and fifth and sixth transistors, each having a pair of output terminals and a control terminal, one of the output terminals of said fifth and sixth transistors being connected to said second voltage supply, the other of the output terminals of said first and second transistors and the control terminals of said second and third transistors being connected to the other side of said current source, the other of the output terminals of said third transistor defining a node which is connected to the other of the output terminals of said fifth transistor and to the control terminals of said fifth and sixth transistors, the other of the output terminals of said sixth transistor being connected to said amplifier output, the improvement comprising:
means for providing a feedforward signal from said amplifier input to said node; and
means for modifying the impedance at said node as an input signal to said amplifier causes said third transistor to approach cutoff.

20. In an amplifier according to claim 19, the improvement wherein said modifying means comprises:
means for reducing the loop transconductance through the signal path including said first, second, third, fifth and sixth transistors as the current through said third transistor is reduced to a small percentage of its quiescent value.

21. In an amplifier according to claim 20, the improvement wherein said feedforward signal providing means comprises:
a second capacitor connected between said amplifier input and said node.

22. In an amplifier according to claim 20, the improvement wherein said impedance modifying means comprises:
means for injecting a fixed current into said node.

23. In an amplifier according to claim 19, the improvement wherein said feedforward signal providing means comprises:

a second capacitor connected between said amplifier input and said node.

24. In an amplifier according to claim 19, the improvement wherein said impedance modifying means comprises:

means for injecting a fixed current into said node.

25. In an amplifier of the type having an input and an output; first and second voltage supplies of opposite polarities; first through fourth transistors, each having a pair of output terminals and a control terminal, one of the output terminals of all of said transistors being connected to said first voltage supply, the control terminals of said first and fourth transistors being connected to said amplifier input, the other of the output terminals of said fourth transistor being connected to said amplifier output; a current source, one side of said source being connected to said second voltage supply; a capacitor connected between said amplifier input and output; and fifth and sixth transistors, each having a pair of output terminals and a control terminal, one of the output terminals of said fifth and sixth transistors being connected to said second voltage supply, the other of the output terminals of said first and second transistors and the control terminals of said second and third transistors being connected to the other side of said current source, the other of the output terminals of said third transistor defining a node which is connected to the other of the output terminals of said fifth transistor and to the control terminals of said fifth and sixth transistors, the other of the output terminals of said sixth transistor being connected to said amplifier output, the improvement comprising:

means for providing a feedforward signal from said amplifier input terminal to said node.

26. In an amplifier according to claim 25, the improvement further comprising:

means for injecting a fixed current into said node.

27. In an amplifier according to claim 26, the improvement wherein said fixed current is operative to prevent said sixth transistor from turning off completely.

28. In an amplifier according to claim 27, the improvement wherein said fixed current is further operative to reduce the transconductance of the signal path including said first, second, third, fifth and sixth transistors significantly as said third transistor turns off.

29. In an amplifier according to claim 28, the improvement wherein said fixed current into said node is further operative to prevent the pole thereat from moving down in frequency below an ascertainable frequency which is a function of the transconductance of said fifth transistor and the total effective capacitance at said node.

30. In an amplifier according to claim 25, the improvement wherein said feedforward signal providing means comprises:

a second capacitor connected between said amplifier input and said node.

31. In an amplifier of the type having an input and an output; first and second voltage supplies of opposite polarities; first through fourth transistors, each having a pair of output terminals and a control terminal, one of the output terminals of all of said transistors being connected to said first voltage supply, the control terminals of said first and fourth transistors being connected to said amplifier input, the other of the output terminals of said fourth transistor being connected to said amplifier output; a current source, one side of said source being connected to said second voltage supply; a capacitor connected between said amplifier input and output; and fifth and sixth transistors, each having a pair of output terminals and a control terminal, one of the output terminals of said fifth and sixth transistors being connected to said second voltage supply, the other of the output terminals of said first and second transistors and the control terminals of said second and third transistors being connected to the other side of said current source, the other of the output terminals of said third transistor defining a node which is connected to the other of the output terminals of said fifth transistor and to the control terminals of said fifth and sixth transistors, the other of the output terminals of said sixth transistor being connected to said amplifier output, the improvement comprising:

means for injecting a fixed current into said node.

32. In an amplifier according to claim 31, the improvement wherein said fixed current is operative to modify the impedance at said node as an input signal to said amplifier causes said third transistor to approach cutoff.

33. In an amplifier according to claim 31, the improvement wherein said fixed current is operative to reduce the maximum value of transconductance through the signal path including said first, second, third, fifth and sixth transistors as the current through said third transistor is reduced to a small percentage of its quiescent value.

34. In an amplifier according to claim 31, the improvement wherein said fixed current is operative to prevent said sixth transistor from turning off completely.

35. In an amplifier according to claim 34, the improvement wherein said fixed current is further operative to reduce the transconductance of the signal path including said first, second, third, fifth and sixth transistors significantly as said third transistor turns off.

36. In an amplifier according to claim 35, the improvement wherein said fixed current into said node is further operative to prevent the pole thereat from moving down in frequency below an ascertainable frequency which is a function of the transconductance of said fifth transistor and the total effective capacitance at said node.

* * * * *